United States Patent [19]

Sakata et al.

[11] Patent Number: 4,610,774
[45] Date of Patent: Sep. 9, 1986

[54] TARGET FOR SPUTTERING

[75] Inventors: Masao Sakata, Yokohama; Shigeru Kobayashi, Tokyo; Katsuo Abe, Yokosuka; Hideaki Shimamura, Yokohama; Tsuneaki Kamei, Kanagawa; Osamu Kasahara, Tokyo; Hidetsugu Ogishi, Hachioji; Takeshi Oyamada, Takasaki, all of Japan

[73] Assignee: Hitachi, Ltd., Tokyo, Japan

[21] Appl. No.: 797,993

[22] Filed: Nov. 14, 1985

[30] Foreign Application Priority Data

Nov. 14, 1984 [JP] Japan ................................. 59-238355
Nov. 14, 1984 [JP] Japan ................................. 59-238356

[51] Int. Cl.[4] ............................................. C23C 15/00
[52] U.S. Cl. ................................. 204/298; 204/192.15
[58] Field of Search ........................... 204/298, 192 R

[56] References Cited

U.S. PATENT DOCUMENTS

| 3,669,871 | 6/1972 | Elmgren et al. | 204/298 |
|---|---|---|---|
| 4,401,539 | 8/1983 | Abe et al. | 204/192 R |
| 4,444,635 | 4/1984 | Kobayashi | 204/192 R |
| 4,448,659 | 5/1984 | Morrison | 204/298 |
| 4,472,259 | 9/1984 | Class et al. | 204/298 |
| 4,547,279 | 10/1985 | Kiyota et al. | 204/298 |
| 4,569,746 | 2/1986 | Hutchinson | 204/298 |

FOREIGN PATENT DOCUMENTS 58-199860 11/1983 Japan .
59-89413 5/1984 Japan .
59-133369 7/1984 Japan .

Primary Examiner—Arthur P. Demers
Attorney, Agent, or Firm—Antonelli, Terry & Wands

[57] ABSTRACT

A sputtering target structure suitable for use with a planar magnetron sputtering electrode device has a plurality of annular target members arranged concentrically. The annular target member is provided with either an annular groove for concentration of an electric field or an annular wall for repelling electrons.

7 Claims, 17 Drawing Figures

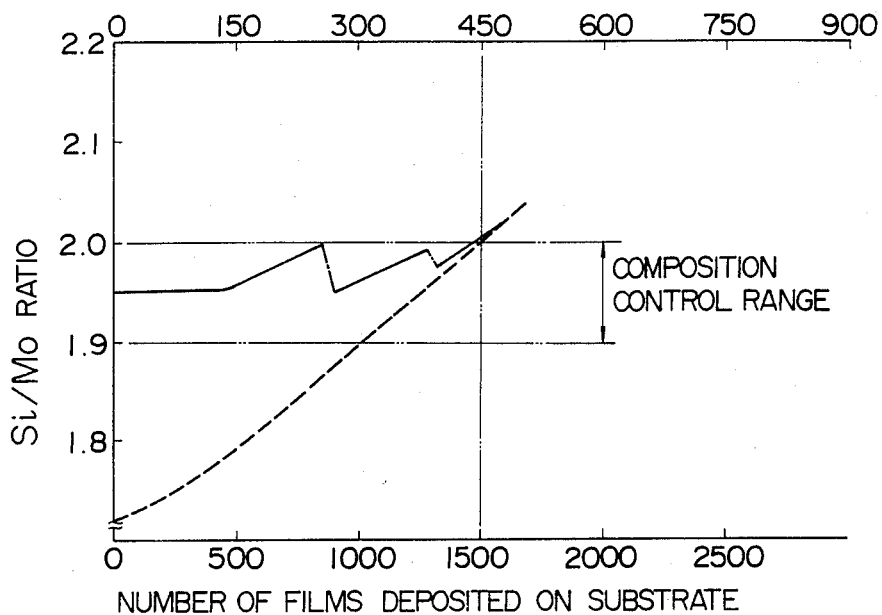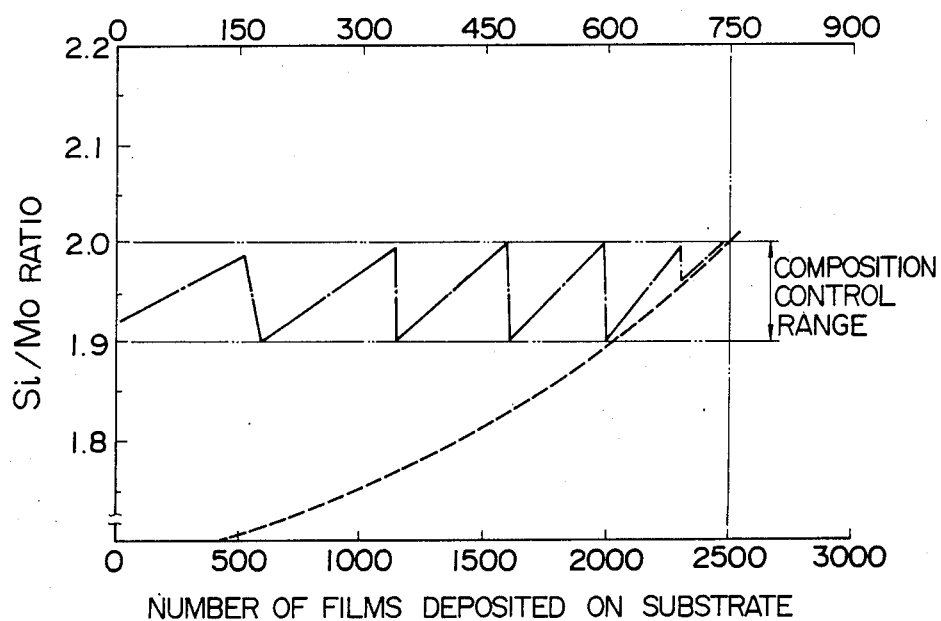

TARGET FOR SPUTTERING

BACKGROUND OF THE INVENTION

This invention relates to a sputtering target for forming thin films by sputtering and more particularly to a sputtering target which an be applied to a long-term use for the thin films formation, that is, can be used repetitiously for the formation of many thin films and which can afford to form thin films of high purity at high rates.

As disclosed in Japanese Patent Unexamined Publication No. 59-89413, a sputtering target used for a conventional method for forming composite films has a structure wherein a silicon disc, a molybdenum ring and a doughnut-like silicon ring are arranged concentrically. Consequently, it has been considered that the conventional method permits forming a film pattern of refractory (high melting point) metal silicide which can be used as a considerably low-resistance wiring pattern for gates for achieving a high speed integrated circuit. In connection with this method for forming an integrated circuit pattern, Japanese Patent Unexamined Publication No. 59-133369 (Japanese Patent Application No. 58-7261) discloses a method of mounting the sputtering target.

No consideration was made in this method, however, about the controlable area or rate of the sputtering target surface nor on the lifetime of the target for producing alloy films of controlled composition.

Meanwhile, Japanese Patent Unexamined Publication No. 58-199860 (Japanese Patent Application No. 57-81457) discloses technique directed to increasing film formation speeds (or growth rate) and obtaining films of high quality and which is considered to be able to control composition in the course of formation of alloy films. This technique, however, took no account of applicability of a sputtering target for high formation rate in the film formation.

SUMMARY OF THE INVENTION

A major object of this invention is to provide a sputtering target so configured as to positively create a spatial volume in which a plasma is highly concentrated for causing a sputtering phenomenon that is effective to erode the sputtering target.

Exemplarily, the sputtering target according to the invention is a multi-annular target structure adapted for formation of alloy films and having a plurality of major surface territories. In a first embodiment of the invention, at least one of the major surface territories subject to sputtering is formed with a groove so that the total amount of particles scattering from the target under sputtering is maintained high for a long period of time. With this construction, it is possible to expand a composition range within which alloy film compositions can be controlled and to prolong lifetime of the target.

More particularly, the multi-annular target structure has a plurality of annular target members with major surface territories subject to sputtering, and a major surface territory of at least one annular target member is formed with a groove. For example in a three zone structure comprising a central disc, an intermediate ring and an outer ring, the intermediate ring has a higher level than the level of the centered disc and the outer ring and is provided with a looped recess or groove in the upper surface.

In a second embodiment of the invention, the target structure is provided at its circumference with a wall which prevents divergence of a plasma created near the outermost annulus of the multiple annuli, so that plasma generative high-frequency electric power which would otherwise disperse outside the target in the prior art can be concentrated above the target so as to increase sputtering efficiency and to assure formation of thin films at higher rates than the prior art. The wall may be replaced with a wall of further outer member which surrounds the outermost target member, thereby attaining the similar effects.

Thus, the sputtering target structure having the wall provided at the outermost target member or around the outermost target member can increase the film formation rate and prolong the lifetime of the target.

BRIEF DESCRIPTION OF THE DRAWINGS

FIG. 3 is a graph showing long-term composition controlling characteristics obtained with a conventional sputtering target;

FIG. 4 is a graph showing long-term composition controlling characteristics obtained with a sputtering target according to the invention;

DESCRIPTION OF THE PREFERRED EMBODIMENTS

Before describing a first embodiment of the invention, creation of annular plasmas necessary for sputtering will first be described with reference to FIG. 14. U.S. Pat. Nos. 4,401,539 and 4,444,635 are incorporated by reference. In a conventional multi-annular sputtering target structure which is not completely planar but has a projecting annular target member, annular plasmas are created above the target structure by using a magnetron sputtering electrode device. U.S. patent application Ser. No. 682,998 filed on Dec. 18, 1984 is further incorporated by reference. Specifically, annular plasmas are created at different positions 601, 602 and 603 and annular target members 401, 402 and 403 respectively made of materials B, A and B are sputtered with these annular plasmas at positions 601, 602 and 603 to form an alloy or composite film on a substrate opposing the target structure. A composition A.Bx of the alloy film is determined by a ratio between staying times or dwell periods of the annular plasmas at the three positions and mainly determined by a degree of purity of material A in the composite film deposited on the substrate by sputtering with the annular plasma at position 602. The degree of purity of material A will herein be represented by A.By.

Accordingly, in order to expand the range of alloy film composition, it is necessary that a suffix y in the purity degree A.By approach to zero. In other words, with the annular plasma positioned at 602, a discharge caused by the magnetron sputtering electrode device, that is, a magnetron discharge must be concentrated on the target member 402 of material A to increase the amount of material A sputtered from the target member 402. Since the magnetron discharge takes place in a region where a magnetic field vector component orthogonally intersects an electric field vector component, a target member 402 of material A according to the first embodiment of the invention is configured such that the number of lines of electric force incident to the surface of the target member 402 is increased.

Figure 1:
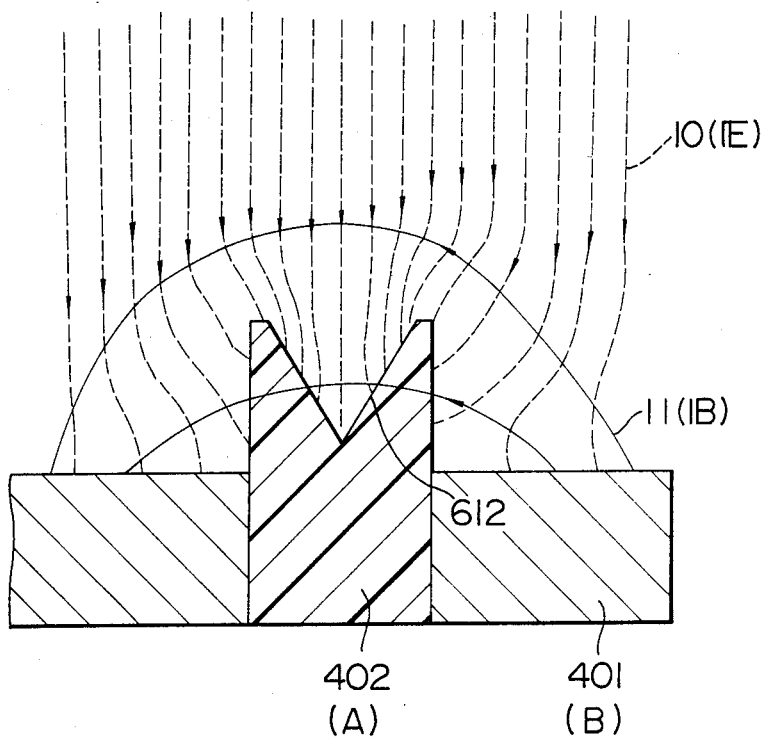
FIG. 1 is a diagram for explaining the principle of a first embodiment of the invention by illustrating an electric field and a magnetic field near a target member formed with a groove.

When the target member 402 is metallic and electrically highly conductive, the lines of electric force are normal to the surface of the target member 402. According to the first embodiment, the surface of the target member 402 is therefore formed with a looped groove which can concentrate an electric field on the target member 402 to thereby provide an electric field distribution as shown at dotted lines 10 in FIG. 1. With this construction, density of an electric field 10 orthogonally or partially orthogonally intersecting a magnetic field 11 is increased at a goove surface 612 (FIG. 1) of the target member 402 to strengthen discharge, thereby increasing the amount of material A sputtered from the target member 402. Consequently, when the annular plasma is moved periodically to take positions 601, 602 and 603 shown in FIG. 14 to form an alloy film, the range of a suffix X in alloy composition A.Bx of the alloy film can be expanded greatly and the sputtering target can be used repetitively for the formation of many alloy films, resulting in prolongation of lifetime of the sputtering target.

Figure 2:
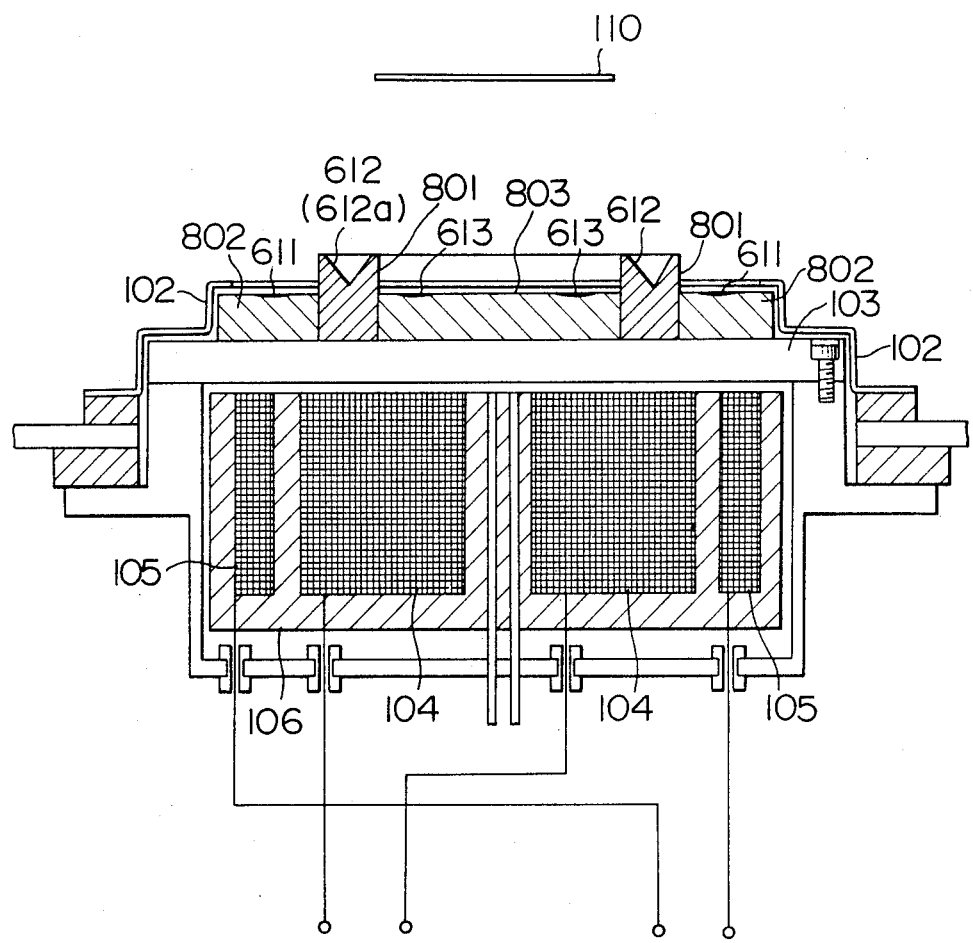
FIG. 2 is a sectional view of a magnetron sputtering electrode device carrying a sputtering target structure according to the first embodiment of the invention.

FIG. 2 shows, in sectional form, a planar magnetron sputtering electrode device to which a sputtering target structure according to the first embodiment of the invention is mounted. The magnetron sputtering electrode device has a double magnetic pole structure by which the diameter of an annular plasma can be varied, as described in U.S. Pat. Nos. 4,401,539, 4,444,635 and the aforementioned Japanese Publications which are incorporated by reference. Reference is also made to U.S. application Ser. No. 682,998 filed on Dec. 18, 1984 which is also incorporated by reference. Referring to FIG. 2, the sputtering target structure is of a multi-annular type and comprises a projecting annular target member 801 made of molybdenum, a doughnut-like target member 802 made of silicon (hereinafter referred to as an outer silicon target member) and a disc-like target member 803 also made of silicon (hereinafter referred to as a central silicon target member). These target members are fixed to a planar backing plate 103 by metal bonding. The molybdenum target member 801 projecting beyond the surfaces of the outer silicon target member 802 and the central silicon target member 803, has an erosion region 612 in the form of a V-shaped groove 612a. The magnetron sputtering electrode device has an annular anode 102, electromagnetic coils 104 and 105, and a magnetic field generative yoke 106. A substrate 110 on which a composite film is formed opposes the sputtering target structure. The outer and central silicon target members 802 and 803 are respectively eroded by sputtering at circular portions 611 and 613.

Figure 13:
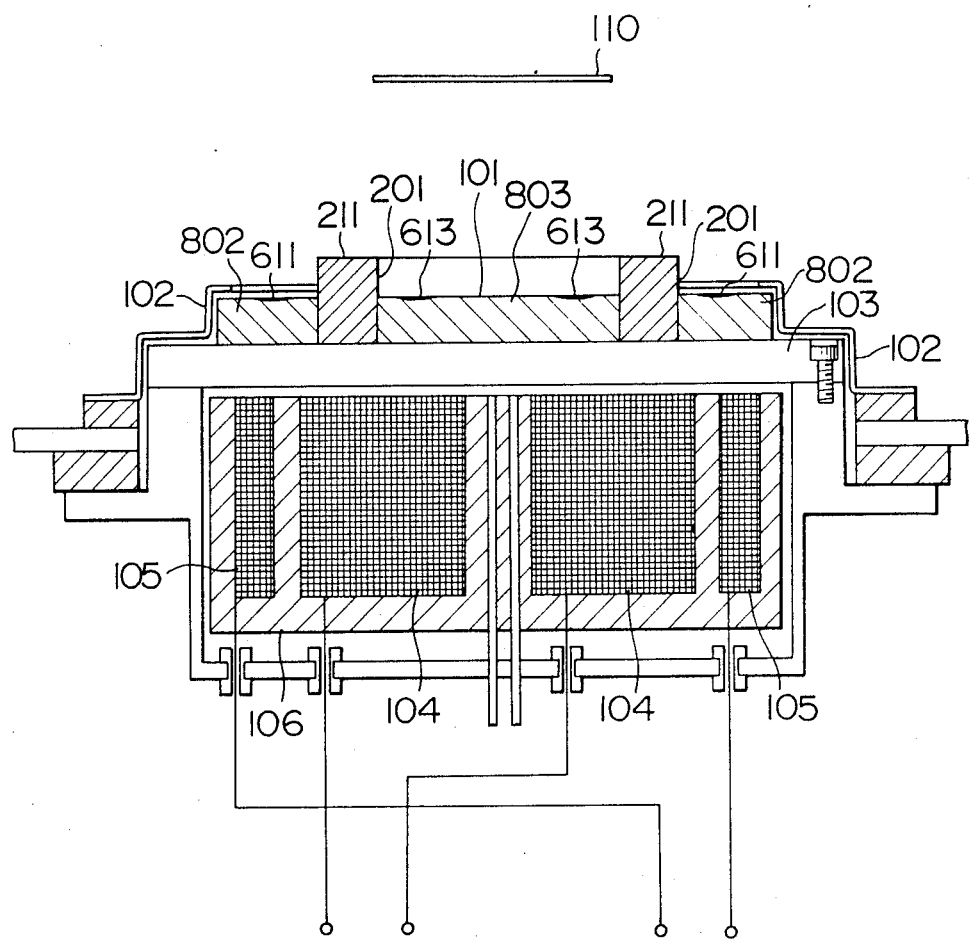
FIG. 13 is a sectional view of a magnetron sputtering electrode device carrying a conventional multi-annular target structure.

Operation and effect of the embodiment constructed as above will now be described. In accordance with this embodiment, the inventors of this application first positioned an annular plasma at the erosion region 612 (FIG. 2) to form a composite film of molybdenum (Mo) and silicon (Si) on the substrate 110 and analyized a composition of the composite film to obtain a lower limit of composition ratio Si/Mo which was 0.8. This composition ratio is representative of a degree of purity of material A which is molybdenum in this example. In contrast, with sputtering target structure as shown in FIG. 13 having a projecting annular molybdenum target member 211 without a groove, a composition ratio Si/Mo which was 1.6. Accordingly, the lower limit of composition ratio of 1.6 obtained with the FIG. 13 target structure was improved to the lower limit of composition ratio of 0.8 by providing the molybdenum target member 801 (FIG. 2) with the erosion region 612 in the form of the V-shaped groove 612a in accordance with teachings of this embodiment. Those results are obtained with the annular plasma positioned above the projecting anhular target members and represented by dotted curves in FIGS. 3 and 4 for the FIG. 13 target structure and FIG. 2 target structure, respectively. The dotted curves starting from 1.6 in FIG. 3 and 0.8 in FIG. 4 increasingly vary as the number of films formed on the substrate increases.

Next, sputtering was effected by periodically changing the diameter of the annular plasma so that the annular plasma was moved at a suitable period to take positions 602, 601 and 603. In this mode, uniform composite films of molybdenum and silicon of an intended composition were sequentially formed on the substrate with the FIG. 13 target structure. In particular, the annular plasma was periodically moved in such a manner that the composition could be controlled as shown at chained curve in FIG. 3 so as to fall within a composition control range. In FIG. 3, abscissa represents the number of films formed on the substrate, that is, the total thickness of accumulation of the deposited films and ordinate represents the composition ratio Si/Mo of films deposited on the substrate.

In contract, with the FIG. 2 target structure embodying the invention, a corresponding characteristic as shown in FIG. 4 was obtained. It will be seen from FIG. 3 that with the conventional target structure, alloy films of molybdenum and silicon which can be formed to have a composition ratio falling within the desired composition control control range Si/Mo=1.9–2.0 amount in number to about 1500 (450 μm in thickness). In contrast, with the FIG. 2 target structure, the number of deposited alloy films is about 2500 (750 μm in thickness) as shown in FIG. 4, indicating a prolonged lifetime of the composition-controlable target, as long as about twice expanded as compared to that of the conventional target.

This results from the fact that the discharge is concentrated on the V-shaped groove 612a formed in the major surface of the projecting molybdenum target member to enhance selection ratio between sputtered particles of molybdenum and silicon.

Figure 5:
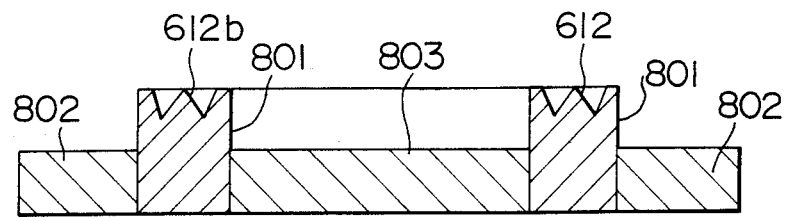
FIGS. 5 to 7 are sectional views showing modifications of the first embodiment.
Figure 6:
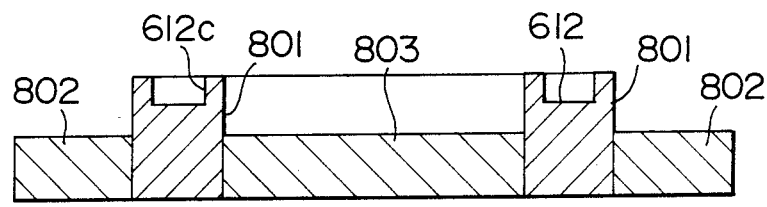
Figure 7:
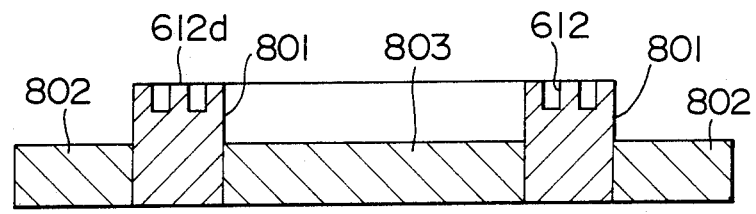

The first embodiment directed to the formation of the groove in the mojor surface of the molybdenum target member can be modified as shown in FIGS. 5, 6 and 7. More particulary, the groove has a cross-sectional configuration of a W shape 612b in the FIG. 5 modification, a cross-sectional configuration of a well or a rectangular shape 612c is the FIG. 6 modification, and a cross-sectional configuration of a double well or double rectangular shape 612d in the FIG. 7 modification. Other shapes than above can also be employed. As described above, according to the first embodiment, when forming by sputtering the alloy films on the substrate which are controlled in composition ratio by using the planar magnetron sputtering electrode device, the width of composition control can be expanded and the lifetime of the target can be prolonged.

A second embodiment of the invention will now be described by comparing it with conventional technique.

Figure 14:
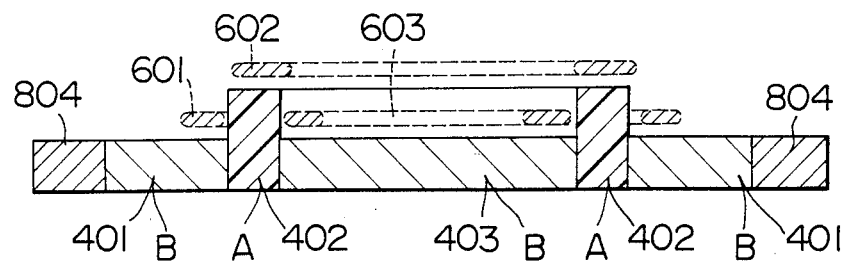
FIG. 14 is a diagram for explaining positions of annular plasmas generated above the target structure.
Figure 16:
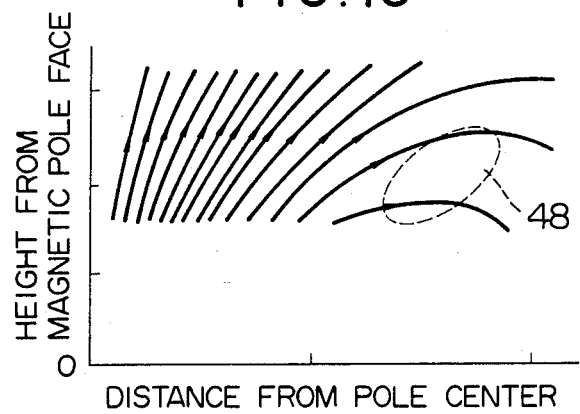
FIG. 16 is a graph showing a magnetic flux distribution which occurs above the target structure to create an outer annular plasma shown in FIG. 14.
Figure 17:
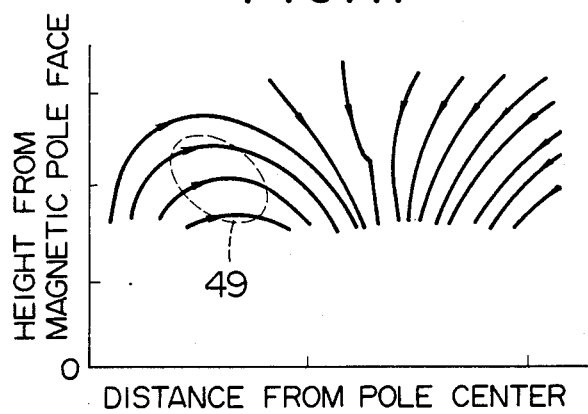
FIG. 17 is a graph showing a magnetic flux distribution which occurs above the target structure to create a central annular plasma shown in FIG. 14.

As described previously, with the multi-annular sputtering target structure which is not completely planar but has the projecting annular target member, annular plasmas are created above the target structure as shown in FIG. 14. The three annular target members of materials B, A and B are sputtered with the annular plasmas at the positions 601, 602 and 603 to form an alloy film on the substrate. A magnetic flux distribution as shown in FIG. 16 is generated to create the annular plasma at the position 601 (FIG. 14) and a magnetic flux distribution as shown in FIG. 17 is generated to create the ammular plasma at the position 603 (FIG. 14). Magnetron discharge takes place in a region where a magnetic field vector component orthogonally intersects an electric field vector component, as also described previously. Since the electric field vector is normal to the major surface of the target, the plasma can be created in a region where the magnetic field vector emponent which is parallel to the target major surface is so large that exceeds a value corresponding to a discharge threshold value. This region is indicated by reference numeral 48 in FIG. 16 and by reference numeral 49 in FIG. 17. In the region 49 of FIG. 17, a Lorentz force acts on electrons in the plasma so as to confine the electrons within the region 49 and as a result, the electrons continue to make a drift motion inside the region 49, thereby exhibiting a prolonged lifetime and generating large energy density. In the region 48 of FIG. 16, however, the lines of magnetic force are divergent and consequently, electrons are partly imparted with a Lorentz force which purges part of the electrons to the outside of the target area and the electrons partly make a drift motion so as to escape from the plasma, with the result that the lifetime of the electrons is decreased as compared to that of the electrons in the region 49 of FIG. 17 and the energy density is reduced. Since the erosion region of the target is directly beneath the plasma and the energy density takes place at a position corresponding to a sputtering field, the outer silicon target member has a smaller sputtering yield than that of the central silicon target member in the conventional sputtering target structure.

In a sputtering target structure according to a second embodiment of the invention, a wall acting as repellent face at the same electrical potential as or lower electric potential than the target members is provided at the outer side of an erosion region of the outer target member so that part of the electrons tending to make a drift motion so as to escape from the target area can efficiently be returned toward the center of the target and the lifetime of the electrons can be prolonged drastrically. Consequently, when sputtering the target by periodically moving the annular plasma to the positions 601, 602 and 603, a film can be formed at a high rate with the annular plasma staying at the position 601 to ensure that an alloy film can be formed at a high rate by the magnetron discharge at the three positions.

Figure 8:
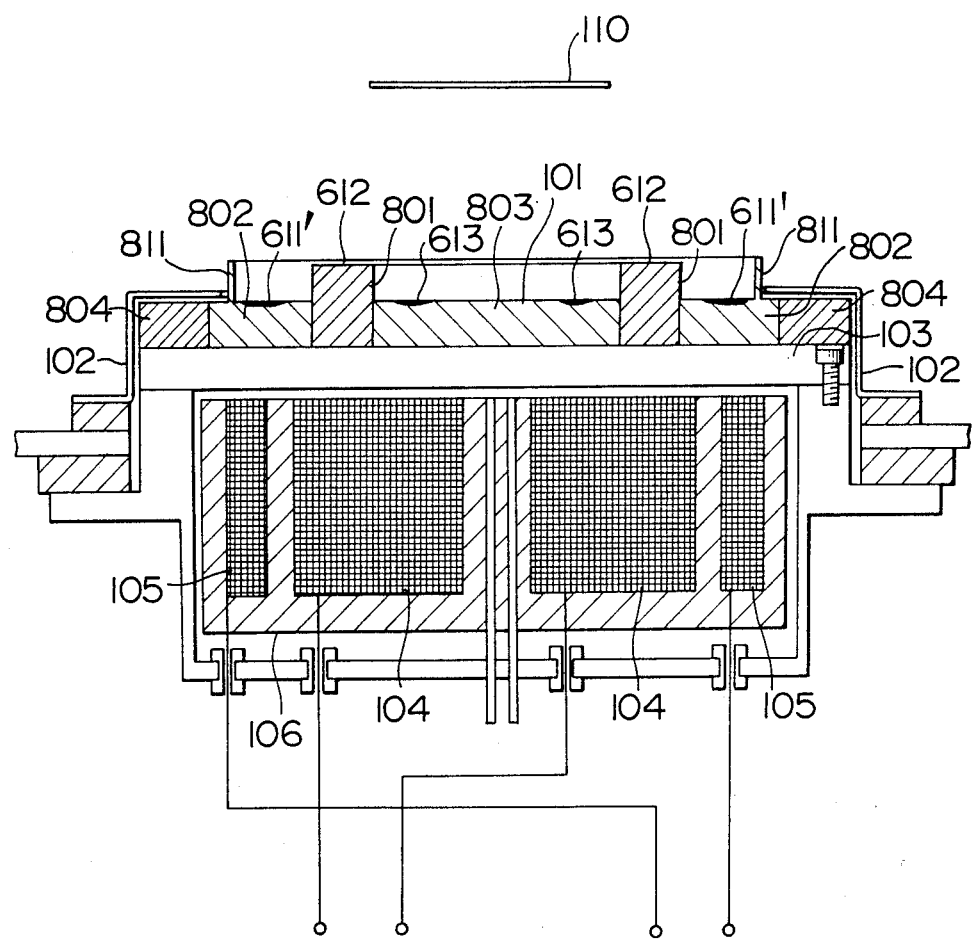
FIG. 8 is a sectional view of a magnetron sputtering electrode device carrying a sputtering target structure according to a second embodiment of the invention.
Figure 9:
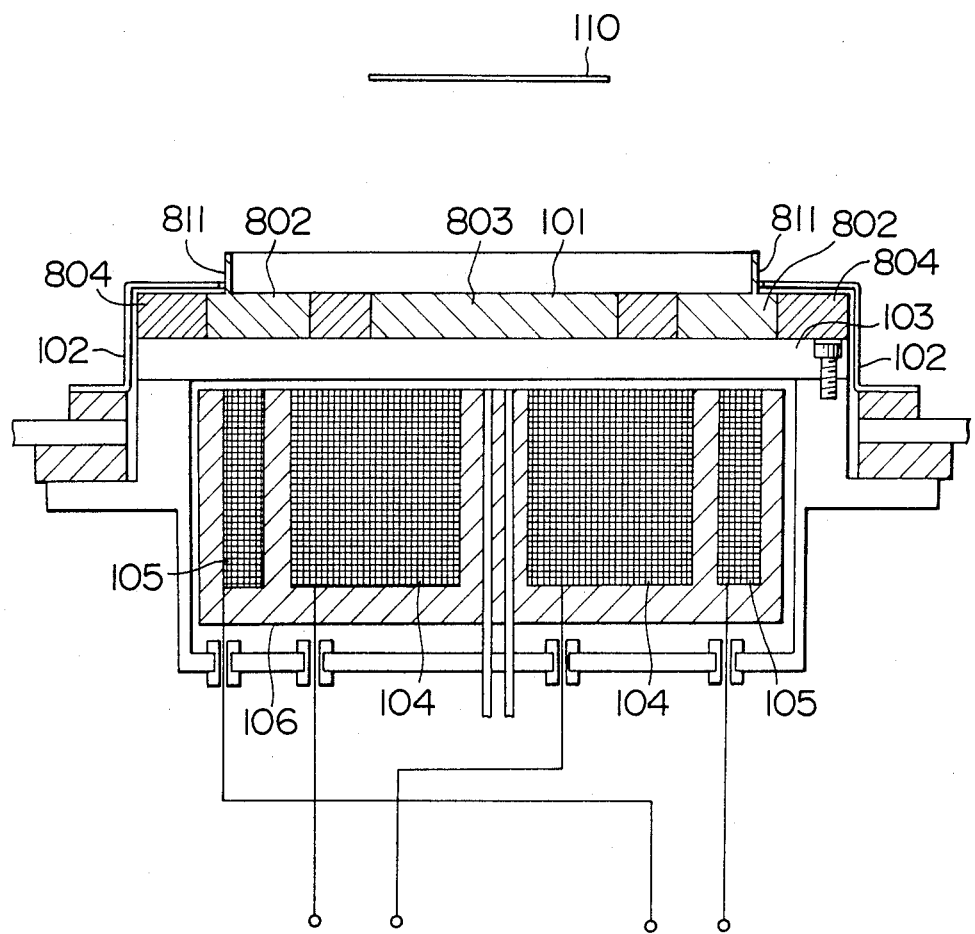
FIG. 9 is a sectional view of a magnetron sputtering electrode device carrying a planar sputtering target disc incorporating the second embodiment of the invention.

FIG. 8 shows, in sectional form, a planar magnetron sputtering electrode device to which a sputtering target structure according to the second embodiment of the invention is mounted. Like the first embodiment, the magnetron sputtering electode device is of a double magnetic pole structure described in the abovementioned U.S. patents and Japanese publications by which the diameter of an annular plasma can be varied. Referring to FIG. 8, the sputtering target structure comprises a projecting annular target member 801 made of molybdenum and an annular member 804 also made of molybdenum. An outer silicon target member 802 is provided, at its outer circumferential portion, with a wall 811 acting as repellent face. The projecting target member 801 has an erosion region 612 and the outer silicon target member 802 has an erosion region 611'. A central silicon target member 803 has an erosion region 613.

Figure 15:
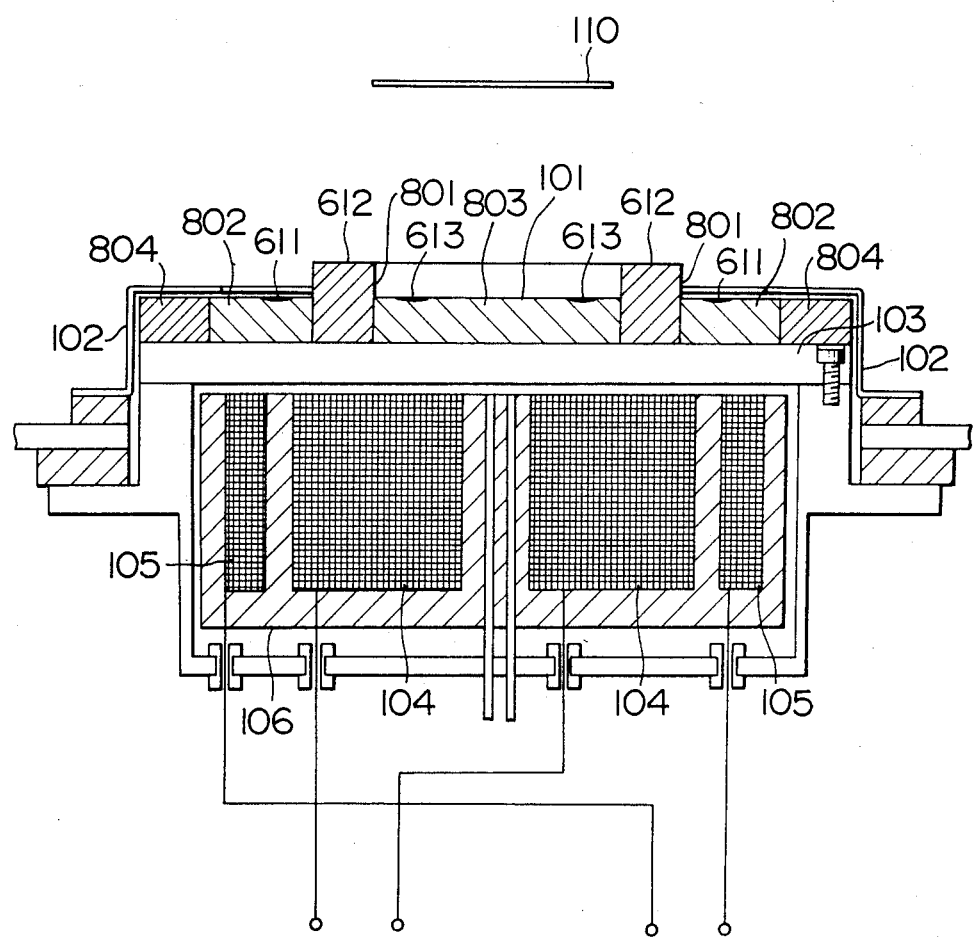
FIG. 15 is a sectional view of a magnetron sputtering electrode device carrying another conventional multi-annular target structure.

Operation and effect of the second embodiment as constructed above will now be described. In accordance with this embodiment, the inventor of this application first positioned an annular plasma at the position 601 (FIG. 14) to form an alloy film of molybdenum and silicon on the substrate 110 and measured a thickness of the alloy film to detect a film formation speed of 1300 Å/min. With a conventional sputtering target structure as shown in FIG. 15 having an outer silicon target member without a wall, however, the formation speed of the same alloy film was 1000 Å/min. Accordingly, the sputtering target structure according to this embodiment having the outer silicon target member with the outer circumferential wall could improve the film formation speed by 30% as compared to that of the FIG. 15 sputtering target structure.

Figure 10:
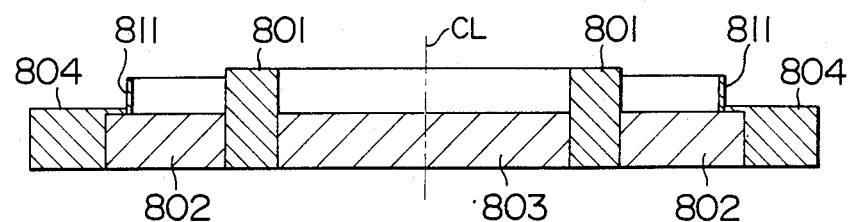
FIG. 10 illustrates, in sectional form, a modification of the second embodiment of the invention.
Figure 11:
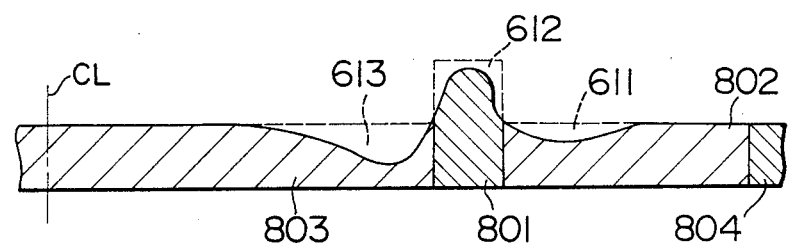
FIG. 11 illustrates target members of the conventional structure sectioned to show contour thereof after a long-term use.
Figure 12:
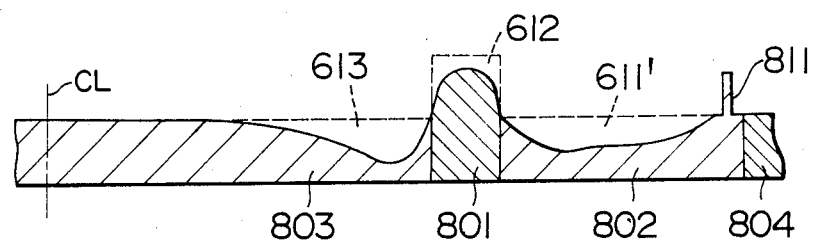
FIG. 12 illustrates target members of the structure according to the invention sectioned to show contour thereof after a long-term use.

When the sputtering target structure shown in FIG. 15 is sputtered for about 1000 hours with the annular plasma periodically moving to the positions 601, 602 and 603 (FIG. 14), this sputtering target structure is eroded to have a contour as shown in FIG. 11. In contrast, when the sputtering target structure shown in FIG. 8 embodying the invention is sputtered for about 1000 hours with the annular plasma periodically moving to the three positions, this target structure is eroded to have a contour as shown in FIG. 12. In FIGS. 10-12, the center line is indicated by CL. In comparison with an erosion region 611 as shown in FIG. 11 obtained with the sputtering target structure of FIG. 15, an erosion region 611' as shown in FIG. 12 obtained with the target structure of FIG. 8 embodying the invention has larger width and depth, indicating that this target structure is utilized at higher efficiency than the conventional target structure.

This is due to the fact that the wall provided at the outer circumferential portion of the outer silicon target member and maintained at the same electric potential or lower potential as the major surface of each target member can repulse and return toward the center of the target the electrons which tend to escape from the target area when the annular plasma is staying at the position 601 and as a result, the plasma energy density within the region 48 (FIG. 16) can be increased as compared to that by the conventional target to thereby increase the sputtering yield associated with the annular plasma staying at the position 601.

The second embodiment directed to the provision of the wall can be modified as shown in FIG. 10. In this modification, the outer silicon target member 802 is not provided with a wall but an outermost annular molybdenum member 804 surrounding the outer silicon target member is provided with a wall 811 which overlies an outer circumferential portion of the outer silicon target member 802.

As described above, the second embodiment can increase the film formation rate when forming a thin film especially an alloy film on the substrate by using the planar magnetron sputtering electrode device.

We claim:

1. A target for sputtering based on magnetron discharge having a plurality of annular target members arranged concentrically with respect to a rotational symmetry axis, said target comprising:

at least one of annular projection projecting beyond a surface of a target member, forming a repellent face of electron and annular recess provided for a target member, for concentration of an electric field.

2. The sputtering target according to claim 1 wherein the target member provided with said annular resess for concentration of the electric field has a cross-sectional area of a V shape configuration.

3. The sputtering target according to claim 1 wherein the target member provided with said annular recess for concentration of the electric field has a cross-sectional area of a rectangular configuration.

4. The sputtering target according to claim 1 wherein the target member provided with said annular recess for concentration of the electric field has a cross-sectional area of a W shape configuration.

5. The sputtering target according to claim 1 wherein the target member provided with said annular recess for concentration of the electric field has a cross-sectional area of a double well configuration.

6. The sputtering target according to claim 1 further comprising an outermost annular member, wherein said annular projection means for reprellent face of the electron is a wall integral with an inner peripheral portion of said outermost annular member, said wall overlying an outer target member.

7. The sputtering target according to claim 1 wherein said annular projection means for repellent face of the electron is a wall integral with an outer circumferential portion of an outer target member, said wall projecting beyond the outer target member.

* * * * *